US009754927B2

(12) United States Patent
Liu et al.

(10) Patent No.: US 9,754,927 B2
(45) Date of Patent: Sep. 5, 2017

(54) METHOD FOR FABRICATING MULTI-CHIP STACK STRUCTURE

(71) Applicant: Siliconware Precision Industries Co., Ltd., Taichung (TW)

(72) Inventors: Chung-Lun Liu, Taichung (TW); Jung-Pin Huang, Taichung (TW); Yi-Feng Chang, Taichung (TW); Chin-Huang Chang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/524,166

(22) Filed: Oct. 27, 2014

(65) Prior Publication Data

US 2015/0044821 A1    Feb. 12, 2015

Related U.S. Application Data

(62) Division of application No. 12/266,830, filed on Nov. 7, 2008, now Pat. No. 8,896,130.

(30) Foreign Application Priority Data

Nov. 30, 2007    (TW) .................. 96145521 A (51) Int. Cl.
*H01L 29/15*    (2006.01)
*H01L 25/00*    (2006.01)
(Continued)

(52) U.S. Cl.
CPC .............. *H01L 25/50* (2013.01); *H01L 21/56* (2013.01); *H01L 24/32* (2013.01); *H01L 24/83* (2013.01);
(Continued)

(58) Field of Classification Search
CPC .......... H01L 21/56; H01L 25/50; H01L 24/32
See application file for complete search history.

(56) References Cited

U.S. PATENT DOCUMENTS 6,538,331 B2    3/2003    Masuda et al.
6,621,155 B1    9/2003    Perino et al.
(Continued)

*Primary Examiner* — Marc Armand
*Assistant Examiner* — Sarah Salerno
(74) *Attorney, Agent, or Firm* — Mintz Levin Cohn Ferris Glovsky and Popeo, P.C.; Peter F. Corless; Steven M. Jensen (57) ABSTRACT

A multi-chip stack structure and a method for fabricating the same are provided. The method for fabricating a multi-chip stack structure includes disposing a first chip group comprising a plurality of first chips on a chip carrier by using a step-like manner, disposing a second chip on the first chip on top of the first chip group, electrically connecting the first chip group and the second chip to the chip carrier through bonding wires, using film over wire (FOW) to stack a third chip on the first and the second chips with an insulative film provided therebetween, wherein the insulative film covers part of the ends of the bonding wires of the first chip on the top of the first group and at least part of the second chip, and electrically connecting the third chip to the chip carrier through bonding wires, thereby preventing directly disposing on a first chip a second chip having a planar size far smaller than that of the first chip as in the prior art that increases height of the entire structure and increases the wiring bonding difficultly.

13 Claims, 5 Drawing Sheets

(51) Int. Cl.
  *H01L 23/00* (2006.01)
  *H01L 25/065* (2006.01)
  *H01L 21/56* (2006.01)
  *H01L 23/31* (2006.01)
  *H01L 25/18* (2006.01)

(52) U.S. Cl.
  CPC .......... *H01L 24/85* (2013.01); *H01L 25/0657* (2013.01); *H01L 23/3107* (2013.01); *H01L 24/73* (2013.01); *H01L 25/18* (2013.01); *H01L 2224/05554* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/83* (2013.01); *H01L 2224/858* (2013.01); *H01L 2225/0651* (2013.01); *H01L 2225/06506* (2013.01); *H01L 2225/06555* (2013.01); *H01L 2225/06562* (2013.01); *H01L 2225/06575* (2013.01); *H01L 2924/00014* (2013.01); *H01L 2924/01033* (2013.01); *H01L 2924/01082* (2013.01); *H01L 2924/1436* (2013.01); *H01L 2924/1438* (2013.01); *H01L 2924/15311* (2013.01); *H01L 2924/15313* (2013.01); *H01L 2924/15321* (2013.01); *H01L 2924/15323* (2013.01); *H01L 2924/181* (2013.01)

(56) References Cited

U.S. PATENT DOCUMENTS

| | | |
|---|---|---|
| 7,312,519 B2 * | 12/2007 | Song .................. H01L 23/3128 257/686 |
| 7,550,834 B2 | 6/2009 | Yu et al. |
| 7,911,045 B2 | 3/2011 | Matsushima et al. |
| 2002/0109216 A1 | 8/2002 | Matsuzaki et al. |
| 2003/0197260 A1 | 10/2003 | Nishimura et al. |
| 2006/0290005 A1 | 12/2006 | Thomas et al. |
| 2008/0150158 A1 | 6/2008 | Chin |

* cited by examiner

METHOD FOR FABRICATING MULTI-CHIP STACK STRUCTURE

CROSS-REFERENCE TO RELATED APPLICATIONS

This application is a divisional of copending application U.S. Ser. No. 12/266,830, filed on Nov. 7, 2008, which claims under 35 U.S.C. §119(a) the benefit of Taiwanese Application No. 096145521, filed Nov. 30, 2007, the entire contents of which are incorporated herein by reference.

BACKGROUND OF THE INVENTION

1. Field of the Invention

The present invention relates generally to a semiconductor structure and method for fabricating the same, and more particularly to a multi-chip stack structure and method for fabricating the same.

2. Description of Related Art

Currently, multi-chip module (MCM) semiconductor packages have been developed to improve performance and capacity of single semiconductor packages, thereby meeting the demand for electronic products having smaller size and higher operation speed. Typically, two or more chips are disposed in a multi-chip module semiconductor package so as to reduce the entire structure volume of electronic products and improve electrical performance of the electronic products. In other words, by combining two or more chips in a single package structure, limit on the system operation speed is minimized, and in addition, the multi-chip package structure can reduce length of connecting circuit between the chips so as to reduce the signal delay and access time.

The multi-chip packages generally have a side-by-side structure, that is, two or more chips are side-by-side disposed to a common substrate, and electrically connected to the substrate by such as wire bonding. However, the side-by-side structure can lead to a high package cost and large package size since the area of the common substrate needs to increase as the number of the chips increases.

Figure 1A:
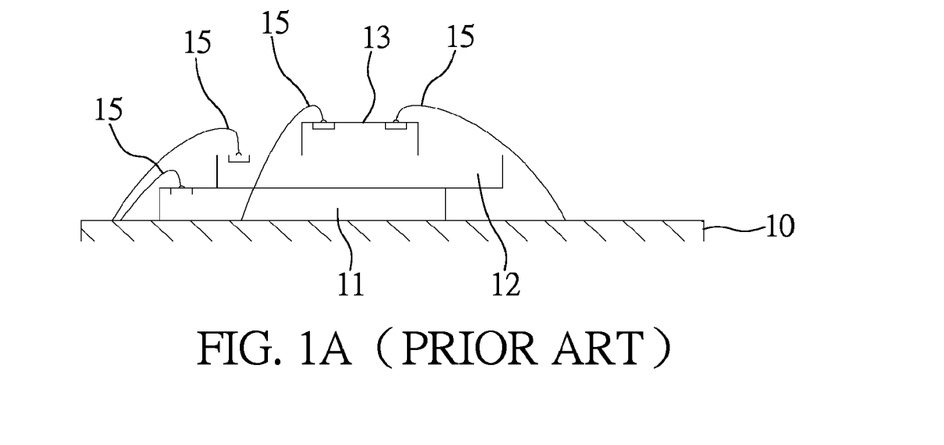
FIGS. 1A and 1B are respectively sectional and planar diagrams of a multi-chip stack structure disclosed by U.S. Pat. No. 6,538,331.
Figure 1B:
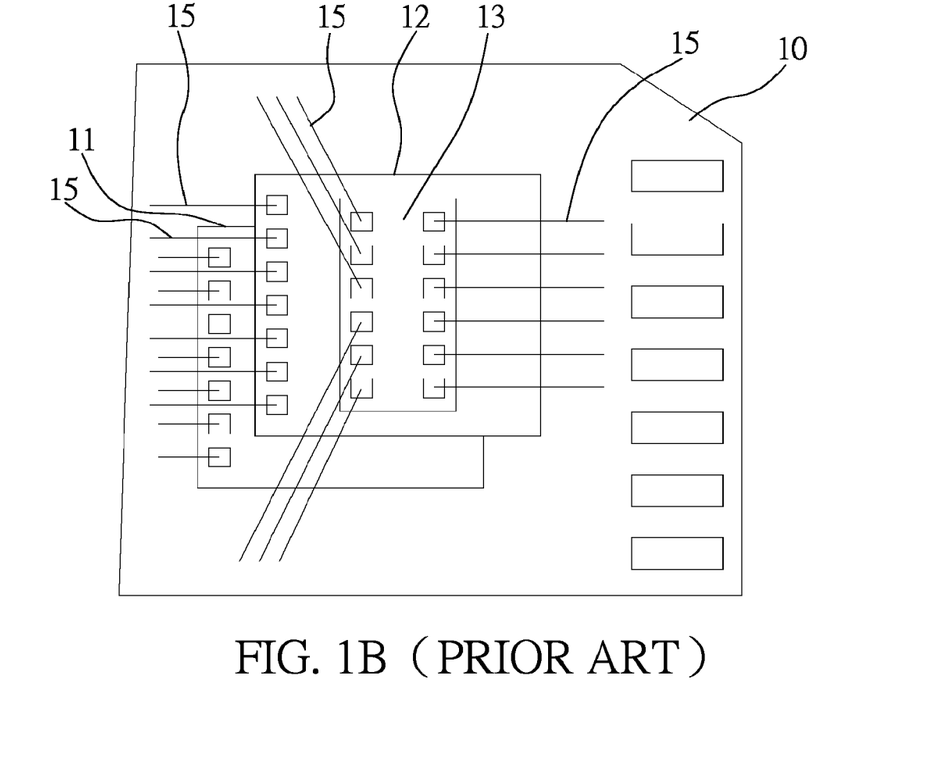

Accordingly, chip stack structures are proposed to overcome the above drawbacks. According to the difference designs of the chips, the wire bonding process of the chip stack structures can be slightly different. For example, if bonding pads of the chips are designed to be located at one side, such as flash memory chips or DRAMs (Dynamic Random Access Memory), the chips are stacked in a step-like manner for facilitating the wire bonding process. As shown in FIGS. 1A and 1B, wherein FIG. 1B is an upper view of FIG. 1A, a multi-chip stack substrate disclosed by U.S. Pat. No. 6,538,331 is shown. A plurality of memory chips is stacked on a chip carrier 10, wherein the first memory chip 11 is disposed on the chip carrier 10, the second memory chip 12 is stacked on the first memory chip 11 and offsets a certain distance from the first memory chip 11 such that the wire bonding process for bonding pads of the first memory chip 11 is not affected by the second memory chip 12. Further, a controller chip 13 is stacked on the second memory chip 12. The memory chips 11, 12 and the controller chip 13 are electrically connected to the chip carrier 10 through a plurality of bonding wires 15.

Figure 2:
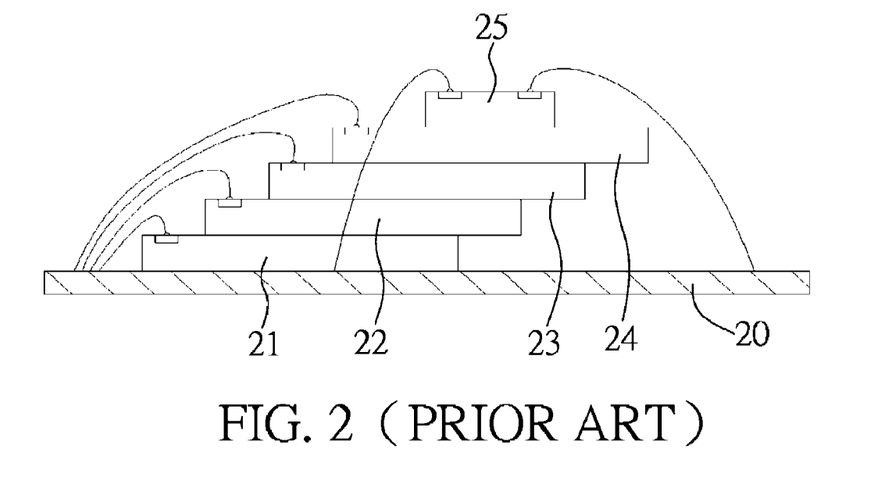
FIG. 2 is a diagram of a multi-chip stack structure disclosed by U.S. Pat. No. 6,621,155.

Further, in order to increase the memory capacity of memory cards, the number of the memory chips also needs to be increased. FIG. 2 shows a multi-chip stack structure disclosed by U.S. Pat. No. 6,621,155, wherein a plurality of memory chips 21, 22, 23, 24 is stacked on a chip carrier 20 in a step-like manner, and a controller chip 25 is further disposed on the memory chips 21, 22, 23, 24.

However, if more and more chips are stacked in the above-described way, the projecting area of the entire structure is continuously increased, when a certain number of the stack layers is reached, the memory chips will go out of the packageable range. Thus, the area of the chip carrier must be increased to finish the chip stack, which however increases the entire package volume and cannot meet requirement of small size and multifunctional electronic products.

Also, as planar size of a controller chip is far smaller than that of a memory chip, when the controller chip is electrically connected to a chip carrier through bonding wires, the bonding wires will definitely pass over the memory chips located below the controller chip, which can easily lead to contact of the bonding wires with the memory chips and even cause short circuit problems. Meanwhile, the wire bonding process becomes much more difficult.

On the other hand, if the controller chip is disposed to a region other than the region for disposing of the memory chips, the use area of the chip carrier is increased.

Figure 3:
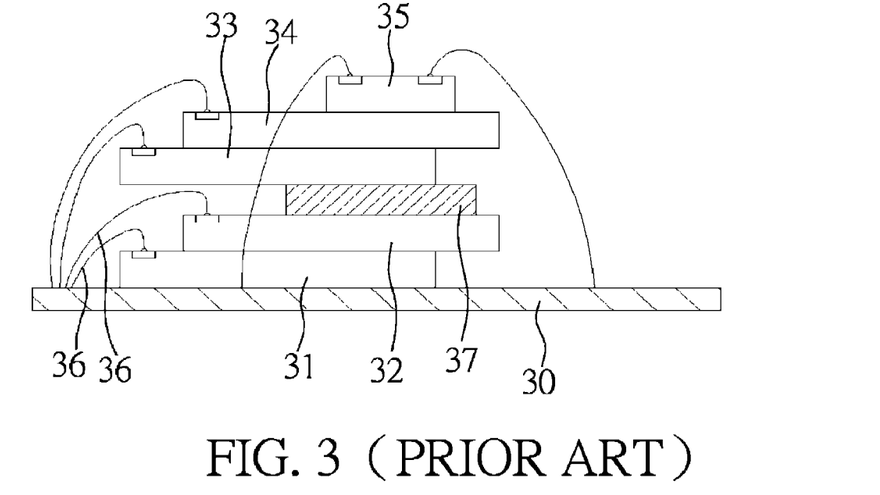
FIG. 3 is a diagram of a multi-chip stack structure disclosed by Taiwan Patent No. 1255492.

Referring to FIG. 3, Taiwan Patent No. 1255492 discloses another multi-chip stack technique, wherein a plurality of memory chips 31, 32 is stacked on a chip carrier 30 in a step-like manner and electrically connected to the chip carrier 30 through bonding wires 36. Then, a buffer layer 37 is disposed on the memory chips 31, 32 and a plurality of memory chips 33, 34 is further disposed on the buffer layer 37 in a step-like manner. Thereafter, a controller chip 35 is disposed on the memory chips 33, 34. Thus, the number of the stacked chips is increased without going out of the packageable range.

However, the above-described method still cannot overcome the problem that the bonding wires of the controller chip contacting the memory chips on the lower side as well as the short circuit problem and wire bonding difficulty. Further, such a method requires long bonding wires and the wire arc is too high, which accordingly increases the process cost and can easily result in a wire sweep problem.

Meanwhile, the disposing of the buffer layer increases the process cost and steps, and also increases the height of the whole multi-chip structure, thereby making it difficult to be applied in fabricating thin type electronic devices such as Micro-SD cards.

Furthermore, in the above-described fabrication processes, as the controller chip is stacked on top of the memory chips, the height of the entire stack structure is adversely affected. In addition, too long bonding wires reduce electrical connection quality. If the number of the stack layers increases, delamination can easily occur on the interface.

Therefore, how to overcome the above-described drawbacks has become urgent.

SUMMARY OF THE INVENTION

Accordingly, an objective of the present invention is to provide a multi-chip stack structure and method for fabricating the same, which allows multi-layer chip stack without increasing the package area and height.

Another objective of the present invention is to provide a multi-chip stack structure and method for fabricating the same, which reduces the stack height and is applicable in thin-type electronic devices.

A further objective of the present invention is to provide a multi-chip stack structure and method for fabricating the same, which can reduce the wire bonding difficulty and prevent bonding wires from contacting the chips so as to avoid short circuit problem.

Still another objective of the present invention is to provide a multi-chip stack structure and method for fabricating the same, which can reduce the required length of bonding wires and arc height so as to reduce the process cost and prevent the conventional wire sweep problem and strengthen the electrical connection quality.

A further objective of the present invention is to provide a multi-chip stack structure and method for fabricating the same, which can decrease the number of the stack layers and probability of delamination occurring on the interface.

Another objective of the present invention is to provide a multi-chip stack structure and method for fabricating the same, which can simplify the fabrication process.

In order to attain the above and other objectives, the present invention discloses a method for fabricating a multi-chip stack structure, which comprises: disposing a first chip group comprising a plurality of first chips on a chip carrier in a step-like manner, disposing a second chip on the first chip on top of the first chip group, wherein the first and second chips are electrically connected to the chip carrier through bonding wires; stacking a third chip on the first chip group and the second chip with an insulative film provided therebetween, the insulative film covering part of the ends of the bonding wire of the first chip on the top of the first chip group and at least part of the second chip; and electrically connecting the third chip with the chip carrier through bonding wires. Thereafter, a fourth chip can be stacked on the third chip in a step-like manner and electrically connected to the chip carrier through bonding wires. Further, an encapsulant can be formed on the chip carrier to encapsulate the chips. Furthermore, the insulative film has such a thickness that the bonding wires of the first and second chips are prevented from contacting the non-active surface of the third chip.

Through the above-described fabrication method, the present invention further discloses a multi-chip stack structure, comprising: a chip carrier; a first chip group comprising a plurality of first chips disposed on the chip carrier in a step-like manner, wherein the first chips are electrically connected to the chip carrier through bonding wires; a second chip disposed on the first chip on top of the first chip group, wherein the second chip is electrically connected to the chip carrier through bonding wires; and a third chip stacked on the first chip group and the second chip with an insulative film provided therebetween, wherein the insulative film covers part of the ends of the bonding wire of the first chip on the top of the first chip group and at least part of the second chip, and the third chip is electrically connected to the chip carrier through bonding wires.

The multi-chip stack structure further comprises a fourth chip stacked on the third chip, and an encapsulant encapsulating the first chip group and the second to fourth chips. In addition, the insulative film has such a thickness that the bonding wires of the first and second chips are prevented from contacting the non-active surface of the third chip.

The chips are electrically connected to the chip carrier through a usual wire bonding method or a reverse wire bonding method, wherein, according to the wire bonding method, the bonding wires has a ball bond formed to connect the chip carrier and then a stitch bond formed to connect the chips, thus reducing the arc height and thickness of the insulative film so as to achieve a much lighter and thinner multi-chip stack structure.

The first, third and fourth chips respectively have bonding pads formed at single side thereof (such as memory chips) and are stacked in a step-like manner. The second chip has bonding pads formed on at least one side thereof (such as controller chip). Planar size of the second chip is smaller than those of the first, third and fourth chips.

Therefore, the present invention comprises disposing a first chip group comprising a plurality of first chips (memory chips) on a chip carrier in a step-like manner; disposing a second chip (a controller chip) on the first chip on top of the first chip group, wherein the first and second chips are electrically connected to the chip carrier through bonding wires; using a film over wire (FOW) technique to stack on the first and second chips a third chip (a memory chip) with an insulative film provided therebetween, wherein the insulative film covers part of the ends of the bonding wires of the first chip on top of the first chip group and at least part of the second chip; and electrically connecting the third chip to the chip carrier through bonding wires. Thus, the controller chip having a size far smaller than the memory chips is prevented from being directly stacked on the memory chips as in the prior art, thereby decreasing height of the entire structure and avoiding wire bonding difficulty and even short circuit problem occurring if the bonding wires of the controller chip pass over and contact the memory chips. Further, as the controller chip is disposed between the memory chips instead of on top of the memory chips as in the prior art, the required length of the bonding wires and the arc height are reduced, thereby saving the fabrication cost, avoiding the wire sweep problem and improving the electrical connection quality. Meanwhile, the number of the chip stack layers is reduced, probability of delamination occurring on the interface is reduced and the process complexity is simplified. Furthermore, as the third chip (memory chip) is stacked on the first and second chips with an insulative film provided therebetween by using a film over wire technique and the insulative film covers part of the ends of the bonding wires of the first chip on the top of the first chip group and at least part of the second chip, the need of a conventional buffer layer is eliminated, thereby enabling the entire structure to become much thinner.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification.

First Embodiment

FIGS. 4A to 4D are sectional diagrams showing a multi-chip stack structure and method for fabricating the same according to a first embodiment of the present invention.

Figure 4A:
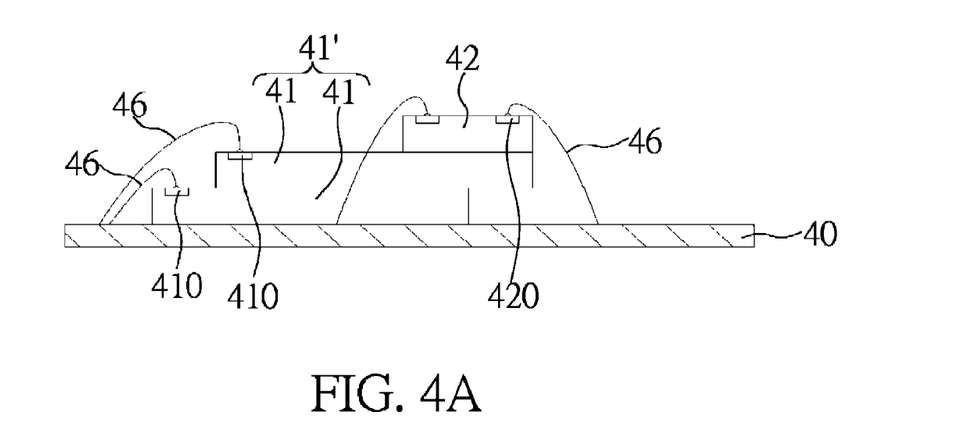
FIGS. 4A to 4D are sectional diagrams showing a multi-chip stack structure and a method for fabricating the same according to a first embodiment of the present invention.

As shown in FIG. 4A, a chip carrier 40 is provided, a first chip group 41' comprising a plurality of first chips 41 is disposed on the chip carrier 40 in a step-like manner, and a second chip 42 is disposed on the first chip on the top of the first chip group 41', wherein the first and second chips 41, 42 are electrically connected to the chip carrier 40 through bonding wires 46.

The first chips 41 and the second chip 42 can be such as memory chips and a controller chip respectively. Planar size of the second chip 42 is smaller than that of the first chips 41, a plurality of bonding pads 410 is disposed at one side on a surface of each first chip 41 and a plurality of bonding pads 420 is disposed at at least one side on a surface of the second chip 42 (the bonding pads 420 are disposed at several sides of the second chip 42 in the drawings). The bonding pads 410, 420 are electrically connected to the chip carrier 40 through bonding wires 46. The chip carrier 40 can be such as a BGA substrate, a LGA substrate or a leadframe. The projecting position of the second chip 42 relative to the chip carrier 40 can be located in the projecting position of the first chip group 41' relative to the chip carrier 40. Thus, the use area of the chip carrier 40 does not increase.

Figure 4B:
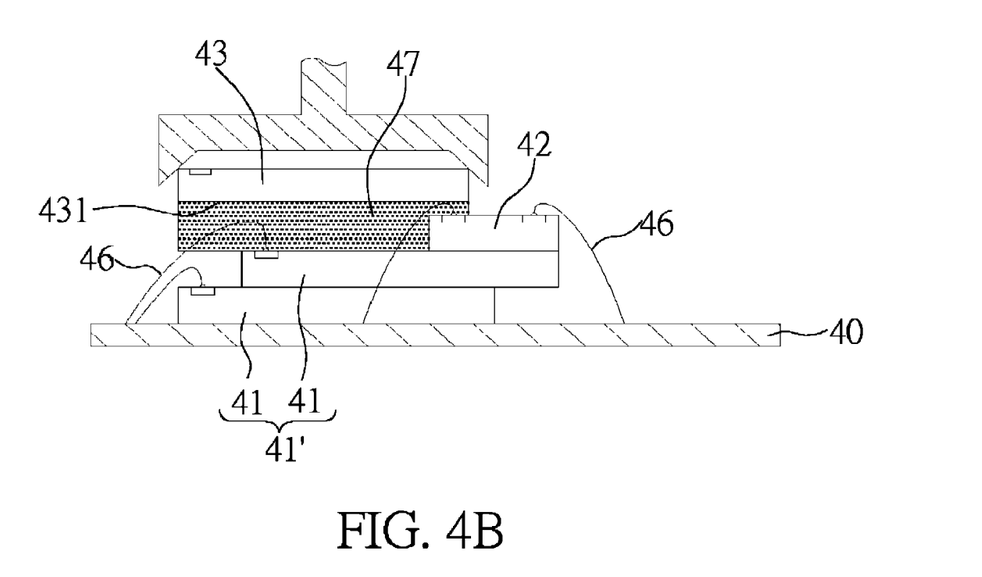

As shown in FIG. 4B, a film over wire (FOW) technique is used to stack a third chip 43 on the first chip group 41' and the second chip 42 with an insulative film 47 provided therebetween. The insulative film 47 also covers part of the ends of the bonding wires of the first chip 41 on top of the first chip group 41' and at least part of the second chip 42. The insulative film 47 has such a thickness that the bonding wires 46 of the first chip 41 and the second chip 42 are prevented from contacting the non-active surface 431 of the third chip 43. The third chip 43 can be such as a memory chip with bonding pads disposed at one side thereof. The projecting position of the third chip 43 relative to the chip carrier 40 can be located in the projecting position of the first chip group 41' relative to the chip carrier 40. Thus, the use area of the chip carrier 40 does not increase.

The insulative film 47 is made of an epoxy resin. The insulative film 47 is pre-attached to the non-active surface 431 of the third chip 43, a heat source (not shown) is disposed below the chip carrier 40 for heating, the third chip 43 with the pre-attached insulative film 47 is then stacked on the first chip group 41' and the second chip 42, as the insulative film 47 goes into a melting state when heated, the bonding wires 46 of the first chip group 41' and the second chip 42 are prevented from being damaged by pressure. Thereafter, the heat source is removed. The insulative film 47 is solidified to support the third chip 43 and cover the bonding wires 46.

Figure 4C:
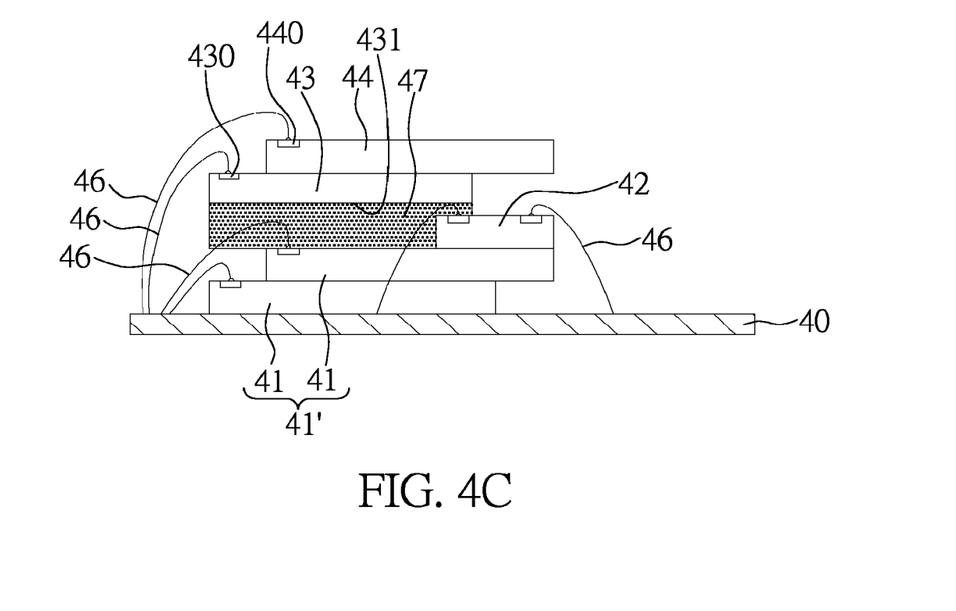

As shown in FIG. 4C, a fourth chip 44 is further stacked on the third chip 43 in a step-like manner. The fourth chip 44 can be such as a memory chip with bonding pads 440 disposed at one side thereof. The side of the fourth chip 44 having bonding pads 440 offsets a certain distance from the third chip 43 so as to expose the region over the bonding pads 430 of the third chip 43. The third and fourth chips 43, 44 can be electrically connected to the chip carrier 40 through a plurality of bonding wires 46.

Figure 4D:
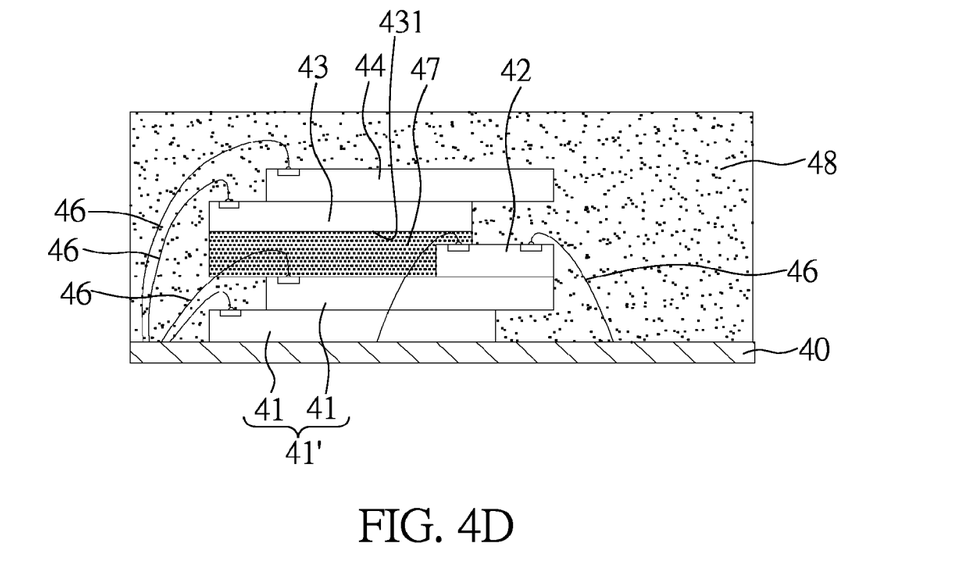

As shown in FIG. 4D, an encapsulant 48 is formed on the chip carrier 40 to encapsulate the first chip group 41', the second chip 42, the third chip 43 and the fourth chip 44.

According to the above-described fabrication method, the present invention further discloses a multi-chip stack structure, which comprises: a chip carrier 40; a first chip group 41' comprising a plurality of first chips 41 disposed on the chip carrier 40 in a step-like manner, wherein the first chips 41 are electrically connected to the chip carrier 40 through bonding wires 46; a second chip 42 disposed on the first chip 41 on the top of the first chip group 41', wherein the second chip 42 is electrically connected to the chip carrier 40 through bonding wires 46; at least a third chip 43 stacked on the first chip group 41' and the second chip 42 with an insulative film 47 provided therebetween, wherein the insulative film 47 covers part of the ends of the bonding wires of the first chip 41 on the top of the first chip group 41' and at least part of the second chip 42, the third chip 43 is electrically connected to the chip carrier 40 through bonding wires 46, the insulative film 47 has such a thickness that the bonding wires 46 of the first chip 41 and the second chip 42 are prevented from contacting the non-active surface 431 of the third chip 43.

The multi-chip stack structure further comprises a fourth chip 44 stacked on the third chip 43, and an encapsulant 48 encapsulating the first chip group 41', the second chip 42, the third chip 43 and the fourth chip 44.

Second Embodiment

Figure 5:
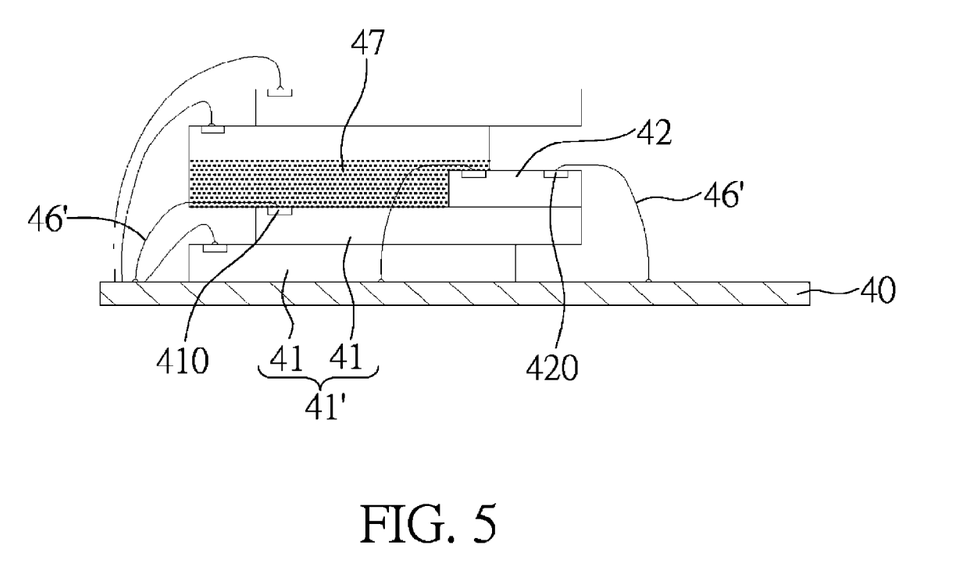
FIG. 5 is a sectional diagram showing a multi-chip stack structure and a method for fabricating the same according to a second embodiment of the present invention.

FIG. 5 is a diagram showing a multi-chip stack structure and method for fabricating the same according to a second embodiment of the present invention. Different from the first embodiment, the present embodiment electrically connects the first chip on top of the first chip group and the second chip with the chip carrier through a reverse wire bonding method.

As shown in FIG. 5, a stud bump (not shown) is first formed on the bonding pads 410 of the first chip 41 on top of the first chip group 41' and the bonding pads 420 of the second chip 42 by a ball bonding method. Then, the bonding wires 46 for electrically connecting the first chip 41 on top of the first chip group 41', the second chip 42 with the chip carrier 40 have a ball bond formed to connect the chip carrier 40 and have a stitch bond formed to connect the stud bump. Thus, the arc height of the bonding wires electrically connecting the first and second chips 41, 42 with the chip carrier 40 is reduced. Thus, the thickness of the insulative film 47 for disposing of the third chip 43 on the first and second chips 41, 42 can further be reduced and accordingly the entire height of the stack structure is reduced.

In addition, the other first chips, the third and fourth chips can be electrically connected to the chip carrier through a usual wire bonding method or the above-described reverse wire bonding method.

Therefore, the present invention comprises disposing a first chip group comprising a plurality of first chips (memory chips) on a chip carrier in a step-like manner; disposing a second chip (a controller chip) on the first chip on top of the first chip group, wherein the first and second chips are electrically connected to the chip carrier through bonding wires; using a film over wire (FOW) technique to stack on the first and second chips a third chip (a memory chip) with an insulative film provided therebetween, wherein the insulative film covers part of the ends of the bonding wires of the first chip on top of the first chip group and at least part of the second chip; and electrically connecting the third chip to the chip carrier through bonding wires. Thus, the controller chip having a size far smaller than the memory chips is prevented from being directly stacked on the memory chips as in the prior art, thereby decreasing height of the entire structure and avoiding wire bonding difficulty and even short circuit problem occurring if the bonding wires of the controller chip pass over and contact the memory chips. Further, as the controller chip is disposed between the memory chips instead of on top of the memory chips as in the prior art, the required length of the bonding wires and the arc height are reduced, thereby saving the fabrication cost, avoiding the bonding wire sweep problem and improving the electrical connection quality. Meanwhile, the number of the chip stack layers is reduced, probability of delamination occurring on the interface is reduced and the process complexity is simplified. Furthermore, as the third chip (memory chip) is stacked on the first and second chips with an insulative film provided therebetween by using a film over wire technique and the insulative film covers part of the ends of the bonding wires of the first chip on the top of the first chip group and at least part of the second chip, the need of a conventional buffer layer is eliminated, thereby enabling the entire structure to become much thinner.

The above-described descriptions of the detailed embodiments are only to illustrate the preferred implementation according to the present invention, and it is not to limit the scope of the present invention. All modifications and variations completed by those with ordinary skill in the art should fall within the scope of present invention defined by the appended claims.

What is claimed is:

1. A method for fabricating a multi-chip stack structure, comprising:
    disposing a first chip group comprising a plurality of first chips on a chip carrier in a step-like manner, disposing a second chip on the first chip on top of the first chip group, wherein the first and second chips are electrically connected to the chip carrier through bonding wires;
    stacking a third chip on the first chip group and the second chip with an insulative film provided therebetween, the insulative film covering part of the ends of the bonding wire of the first chip on the top of the first chip group and at least part of the second chip, wherein the first chip and the third chip contact the insulative film, and the third chip is free from contacting the first chip group and the second chip;
    electrically connecting the third chip with the chip carrier through bonding wires; and
    forming an encapsulant on the chip carrier to encapsulate the first chip group, the second chip, and the third chip.

2. The method of claim 1, wherein planar size of the second chip is smaller than that of the first chip.

3. The method of claim 1, wherein the first and third chips are memory chips, and the second chip is a controller chip.

4. The method of claim 3, wherein the first and third chips respectively have a plurality of bonding pads disposed on surface of one side thereof, and the second chip has a plurality of bonding pads disposed on surface of at least one side thereof.

5. The method of claim 1, wherein the chip carrier is one of a BGA substrate, a LGA substrate and a leadframe.

6. The method of claim 1, wherein a film over wire (FOW) technique is used to stack the third chip on the first chip group and the second chip with the insulative film provided therebetween.

7. The method of claim 1, wherein the insulative film is pre-attached to the non-active surface of the third chip, a heat source is disposed below the chip carrier for heating, the third chip with the pre-attached insulative film is stacked on the first chip group and the second chip, thereafter, the heat source is removed, the insulative film is solidified so as to support the third chip and cover the bonding wires.

8. The method of claim 1, wherein the first and second chips are electrically connected to the chip carrier by one of a usual wire bonding method and a reverse wire bonding method.

9. The method of claim 1 further comprising stacking a fourth chip on the third chip in a step-like manner.

10. The method of claim 9, wherein the third and fourth chips are electrically connected to the chip carrier by one of a usual wire bonding method and a reverse wire bonding method.

11. The method of claim 9, wherein the fourth chip is a memory chip.

12. The method of claim 9, wherein the encapsulant encapsulates the fourth chip.

13. The method of claim 1, wherein the projecting position of the second and third chips relative to the chip carrier is located in the projecting position of the first chip group relative to the chip carrier.

* * * * *